(12) United States Patent
Lai et al.

(10) Patent No.: US 10,718,839 B2
(45) Date of Patent: Jul. 21, 2020

(54) METHOD AND APPARATUS FOR CORRECTING UNIFORMITY OF A MAGNETIC RESONANCE IMAGE

(71) Applicant: GE Precision Healthcare LLC, Wauwatosa, WI (US)

(72) Inventors: Yongchuan Lai, Beijing (CN); Xiaoli Zhao, Waukesha, WI (US); Weiwei Zhang, Waukesha, WI (US); Stephen Joseph Garnier, Waukesha, WI (US); Lisha Nie, Beijing (CN); Pengfei Lu, Beijing (CN); Hongbin Wang, Beijing (CN)

(73) Assignee: GE PRECISION HEALTHCARE LLC, Wauwatosa, WI (US)

( * ) Notice: Subject to any disclaimer, the term of this patent is extended or adjusted under 35 U.S.C. 154(b) by 275 days.

(21) Appl. No.: 15/799,025

(22) Filed: Oct. 31, 2017

(65) Prior Publication Data

US 2018/0120399 A1 May 3, 2018

(30) Foreign Application Priority Data

Oct. 31, 2016 (CN) .......................... 2016 1 0933968

(51) Int. Cl.
*G01R 33/56* (2006.01)
*G01R 33/36* (2006.01)
(Continued)

(52) U.S. Cl.
CPC .............. *G01R 33/56* (2013.01); *G01R 33/36* (2013.01); *G01R 33/5659* (2013.01); *G01R 33/3415* (2013.01); *G01R 33/34046* (2013.01)

(58) Field of Classification Search
CPC ........ G01R 33/00; G01R 33/20; G01R 33/28; G01R 33/32; G01R 33/34;
(Continued)

(56) References Cited

U.S. PATENT DOCUMENTS 7,432,707 B1 10/2008 Boitano
8,093,894 B2 * 1/2012 Machida ............ G01R 33/3415
324/307

(Continued)

FOREIGN PATENT DOCUMENTS

EP 2411829 B1 10/2015

OTHER PUBLICATIONS

Cheng et al., Magnetic Resonance Imaging Image Intensity Correction with Extrapolation and Adaptive Smoothing, Magnetic Resonance in Medicine 55:959-996 (2006).

*Primary Examiner* — Hoai-An D. Nguyen
(74) *Attorney, Agent, or Firm* — Armstrong Teasdale LLP

(57) ABSTRACT

The present invention provides a method and apparatus for correcting a uniformity of a magnetic resonance image, the method including: acquiring a first uniformity enhancement image by a phased-array uniformity enhancement method; and dividing the first uniformity enhancement image by a receiving sensitivity distribution value of a body coil in a magnetic resonance imaging device, so as to acquire a second uniformity enhancement image. The method further includes: dividing the second uniformity enhancement image by a spatial signal distribution value resulting from a field strength distribution of a transmitting radio-frequency field, so as to acquire a third uniformity enhancement image.

14 Claims, 2 Drawing Sheets

(51) Int. Cl.
    *G01R 33/34*     (2006.01)
    *G01R 33/565*     (2006.01)
    *G01R 33/3415*     (2006.01)

(58) Field of Classification Search
    CPC ............ G01R 33/34046; G01R 33/341; G01R 33/3415; G01R 33/36; G01R 33/44; G01R 33/48; G01R 33/54; G01R 33/56; G01R 33/565; G01R 33/5659; G06T 5/00; G06T 5/50; A61B 5/00; A61B 5/05; A61B 5/055
    USPC .......................... 324/300, 301, 307, 309, 310
    See application file for complete search history.

(56) References Cited

U.S. PATENT DOCUMENTS

| | | |
|---|---|---|
| 8,810,242 B2 | 8/2014 | Dannels |
| 9,146,293 B2 | 9/2015 | Wang et al. |
| 9,316,707 B2* | 4/2016 | Khalighi ............... G01R 33/246 |
| 2006/0106299 A1* | 5/2006 | Uchizono ........... G01R 33/3415 600/410 |
| 2008/0231273 A1* | 9/2008 | Kabasawa .............. G01R 33/56 324/309 |
| 2011/0163750 A1* | 7/2011 | Chen .................. G01R 33/3875 324/320 |

\* cited by examiner

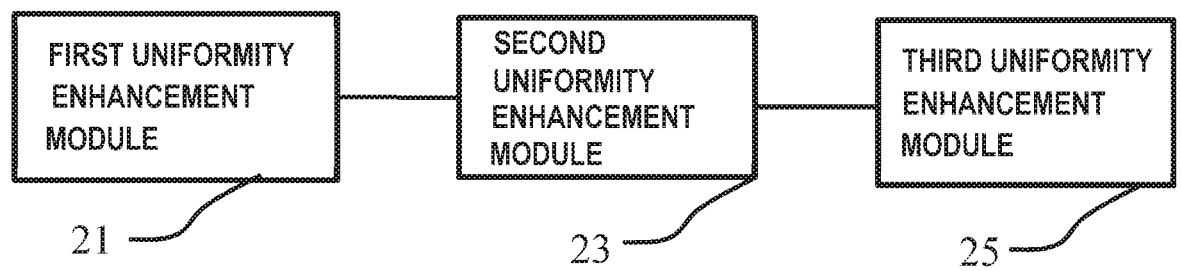
FIG. 2
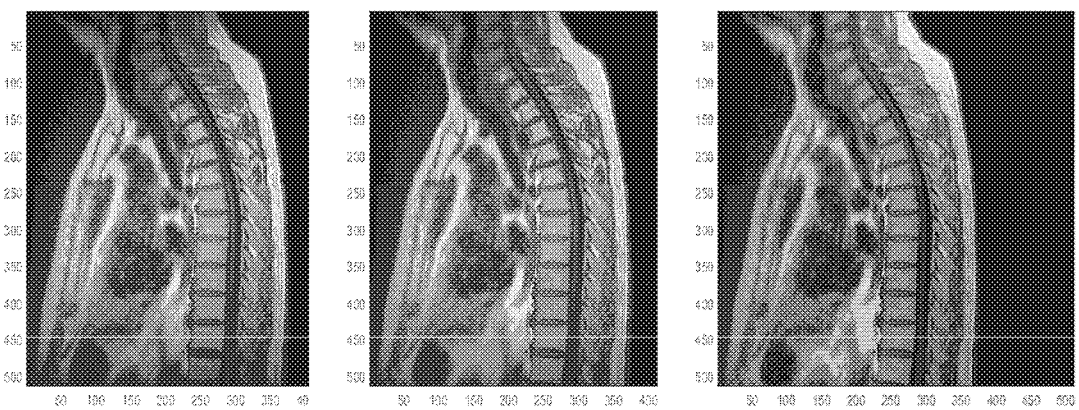
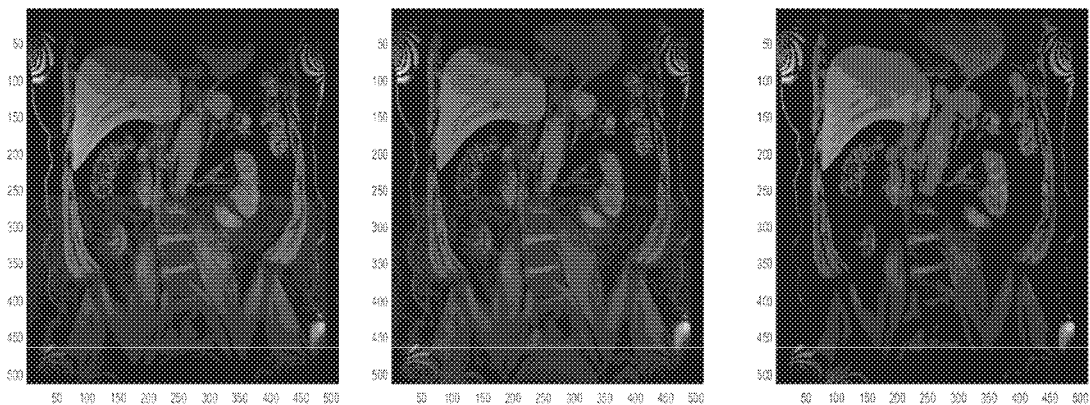
FIG. 3　　　　　　FIG. 4　　　　　　FIG. 5

METHOD AND APPARATUS FOR CORRECTING UNIFORMITY OF A MAGNETIC RESONANCE IMAGE

CROSS-REFERENCE TO RELATED APPLICATIONS

This application claims priority to Chinese Patent Application No. 201610933968.9, filed on Oct. 31, 2016, the entirety of which is incorporated herein by reference.

BACKGROUND

The present invention relates to the field of medical imaging, and more particular to, a method and apparatus for correcting a uniformity of a magnetic resonance image.

In current magnetic resonance imaging technology, before performing an imaging scan on a patient, a sensitivity distribution of a surface coil may be acquired by a calibration scan (pre-scan), so that the image uniformity enhancement may be performed with the sensitivity distribution, thus a more uniform image can be acquired after the imaging scan. In general, it is considered that the sensitivity of the body coil in the apparatus for correcting a uniformity of a magnetic resonance image is uniformly distributed. Therefore, in the calibration scan, a body coil image and a surface coil image may be respectively acquired under a specific imaging pulse sequence, and a zero sensitivity distribution of the above-mentioned surface coil is obtained according to the body coil image, the surface coil image and the sensitivity of the body coil.

With the rapid development of magnetic resonance imaging technology, the body coils used in magnetic resonance imaging systems may not be uniform in sensitivity due to changes in the size or other parameters, resulting in the inaccurate sensitivity distribution of the obtained surface coils. Therefore, the sensitivity distribution of the surface coil can no longer be used to calibrate the image acquired by the imaging scan, otherwise the uniformity of the obtained patient image would be lower.

Therefore, it is necessary to provide a novel method and apparatus for correcting a uniformity of a magnetic resonance image, which can acquire a patient image with enhanced uniformity.

SUMMARY

One objective of the present invention is to provide a novel method for correcting a uniformity of a magnetic resonance image and apparatus for correcting a uniformity of a magnetic resonance image, so as to enhance the uniformity of the magnetic resonance image.

Exemplary embodiments of the present invention provide a method for correcting a uniformity of a magnetic resonance image, the method comprising: acquiring a first uniformity enhancement image by a phased-array uniformity enhancement method; and dividing the first uniformity enhancement image by a receiving sensitivity distribution value of a body coil in a magnetic resonance imaging device, so as to acquire a second uniformity enhancement image.

Optionally, the method may further comprise: dividing the second uniformity enhancement image by a spatial signal distribution value resulting from a field strength distribution of a transmitting radio-frequency (RF) field, so as to acquire a third uniformity enhancement image.

Exemplary embodiments of the present invention provide an apparatus for correcting a uniformity of a magnetic resonance image, comprising a first uniformity enhancement module and a second uniformity enhancement module. The first uniformity enhancement module is used for acquiring a first uniformity enhancement image by a phased-array uniformity enhancement method; the second uniformity enhancement module is used for dividing the first uniformity enhancement image by a receiving sensitivity distribution value of a body coil in a magnetic resonance imaging device, so as to acquire a second uniformity enhancement image.

Optionally, the apparatus may further comprise a third uniformity enhancement module for dividing the second uniformity enhancement image by a spatial signal distribution value resulting from a field strength distribution of a transmitting radio-frequency (RF) field, so as to acquire a third uniformity enhancement image.

Other features and aspects will be apparent through the following detailed description, figures and claims.

BRIEF DESCRIPTION OF THE DRAWINGS

The present invention can be understood better in light of the description of exemplary embodiments of the present invention with reference to the accompanying drawings, in which:

FIG. 2 is a block diagram of an apparatus for correcting a uniformity of a magnetic resonance image provided by another embodiment of the present invention;

FIG. 3 is a uniformity enhancement image obtained by the existing image uniformity enhancement technique;

FIG. 4 is a uniformity enhancement image obtained by correcting a receiving sensitivity of the image in FIG. 3 by the embodiments of the present invention; and FIG. 5 is a uniformity enhancement image obtained by correcting a transmitting RF field of the image in FIG. 4 by the embodiments of the present invention.

DETAILED DESCRIPTION

Figure 1:
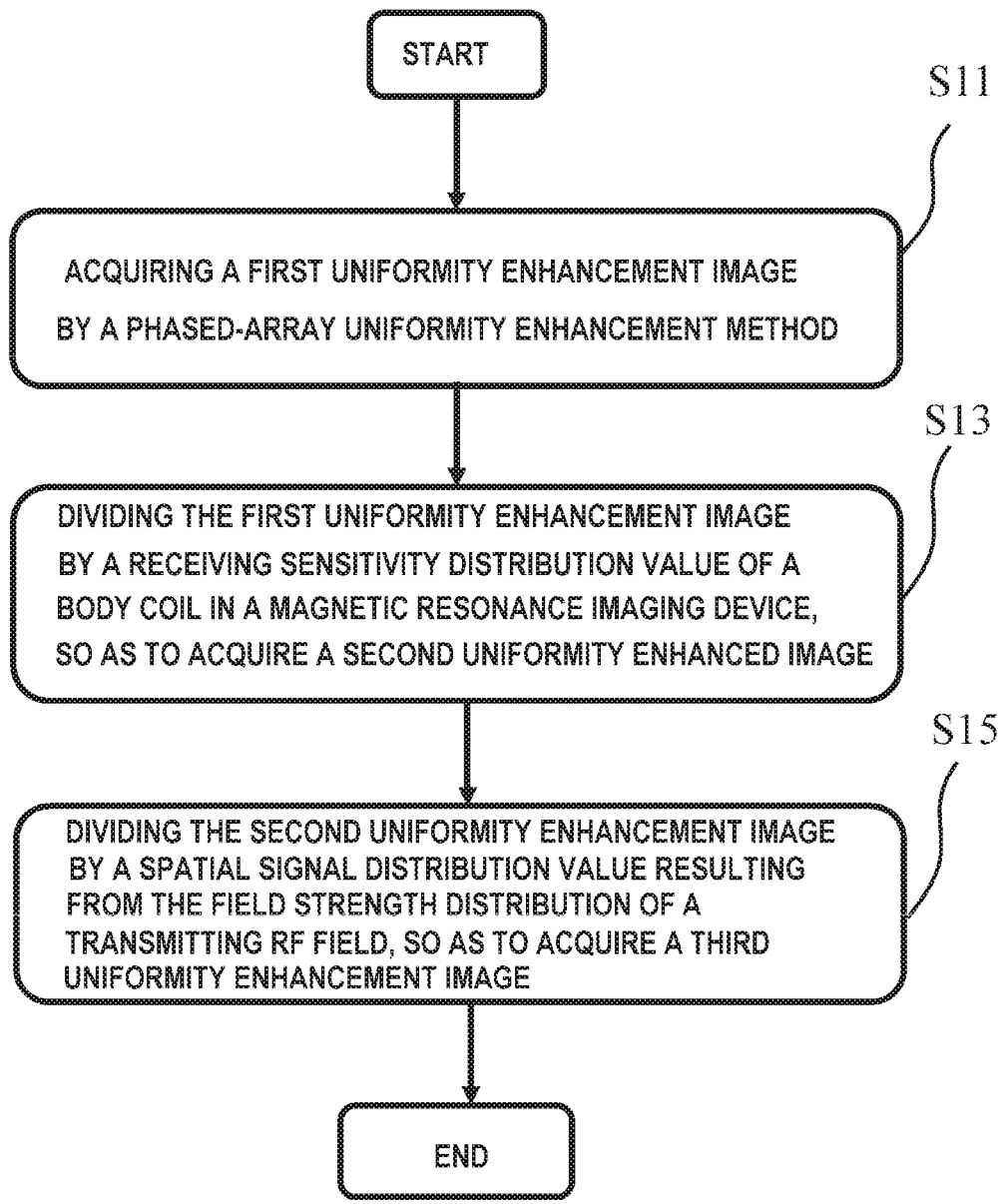
FIG. 1 is a flow chart of a method for correcting a uniformity of a magnetic resonance image provided by one embodiment of the present invention.

Hereafter, a detailed description will be given for embodiments of the present disclosure. It should be pointed out that in the detailed description of the embodiments, for simplicity and conciseness, it is impossible for the description to describe all the features of the practical embodiments in detail. It should be understood that in the process of a practical implementation of any embodiment, just as in the process of an engineering project or a designing project, in order to achieve a specific goal of the developer and in order to satisfy some system-related or business-related constraints, a variety of decisions will usually be made, which will also be varied from one embodiment to another. In addition, it can also be understood that although the effort made in such developing process may be complex and time-consuming, some variations such as design, manufacture and production on the basis of the technical contents disclosed in the disclosure are just customary technical means in the art for those of ordinary skilled in the art associated with the contents disclosed in the present disclosure, which should not be regarded as insufficient disclosure of the present disclosure.

Unless defined otherwise, all the technical or scientific terms used in the claims and the description should have the same meanings as commonly understood by one of ordinary skilled in the art to which the present disclosure belongs. The terms "first," "second," and the like in the description and the claims of the present application do not mean any sequential order, number or importance, but are only used for distinguishing different components. The terms "a", "an" and the like do not denote a limitation of quantity, but denote the existence of at least one. The terms "comprises," "comprising, "includes," "including," and the like mean that the element or object in front of the "comprises," "comprising," "includes," and "including" covers the elements or objects and their equivalents illustrated following the "comprises," "comprising," "includes," and "including," but do not exclude other elements or objects. The term "coupled" or "connected" or the like is not limited to being connected physically or mechanically, nor limited to being connected directly or indirectly.

The method for correcting a uniformity of a magnetic resonance image in the embodiments of the present invention may be used in a magnetic resonance imaging device to acquire a magnetic resonance image of a part-to-be-detected of a patient. It should be understood by those skilled in the art that the magnetic resonance imaging device may comprise a main magnet for generating a main magnetic field, a radio frequency (RF) system for generating an RF field, and a gradient system for generating a gradient field. The RF system may comprise a body coil and a surface coil, wherein the body coil may serve as an RF transmitting coil and/or an RF receiving coil, and the surface coil may serve as an RF receiving coil. The magnetic resonance imaging device may further comprise a computer system that may control a pulse generator to generate RF pulses, gradient pulses and the like, to control the RF system and the gradient system to emit signals acting on a human body, to finally receive magnetic resonance signals from the human body for image reconstruction.

FIG. 1 is a flow chart of a method for correcting a uniformity of a magnetic resonance image provided by one embodiment of the present invention. As shown in FIG. 1, the method comprises Steps S11 and S13.

Step S11: acquiring a first uniformity enhancement image $I'_{SC}$ by a phased-array uniformity enhancement (PURE) method. It should be understood by those skilled in the art that the PURE is a method for enhancing uniformity of signals of a multi-channel surface coil, which, in one embodiment, may include the following steps.

The first step, performing a pre-scan (calibration scan) to acquire a body coil image $I_{body}$ and a surface coil image $I_{sc}$, wherein:

$$I_{body} = f_{PSD}(I, FA) * S_{body} \quad (1)$$

$$I_{sc} = f_{PSD}(I, FA) * S_{sc} \quad (2)$$

In the above equations (1) and (2), $I_{body}$ is the body coil image, and $I_{SC}$ is the surface coil image. $f_{PSD}(I, FA)$ is a function using a scanned object I (scanned objects with different attributes or tissues have different vertical relaxation time T1 and horizontal relaxation time T2) and a flip angle (FA) as variables for a preset pulse sequence, which may be referred to as a spatial signal distribution value resulting from the field strength distribution of the transmitting RF field. $S_{body}$ is the receiving sensitivity of the body coil, and $S_{sc}$ is the receiving sensitivity of the surface coil. In the existing PURE method, the receiving sensitivity of the body coil $S_{body}$ is considered to be uniformly distributed at various points in space, for example, "1;" and in the existing PURE method, the flip angle of each point in the space is regarded as the same, that is, the spatial signal distribution value $f_{PSD}(I, FA)$ resulting from the field strength distribution of the transmitting RF field is considered to be uniform.

The second step, performing an imaging scan on the patient to acquire an original image of the patient.

The third step, performing correction on the original image of the patient according to the body coil image and the surface coil image acquired in the pre-scan, so as to acquire the first uniformity enhancement image.

Specifically, the spatial sensitivity $S_{sc}$ of the surface coil may be acquired first according to the following equation (3), and uniformity enhancement is performed on the original image of the patient according to the acquired spatial sensitivity $S_{sc}$ of the surface coil to acquire the first uniformity enhancement image $I'_{SC}$.

$$S_{SC} = \frac{I_{SC}}{I_{body}} \quad (3)$$

In practice, there may be cases where the receiving sensitivity $S_{body}$ of the body coil is unevenly distributed for some reasons of hardware, so the first uniformity enhancement image $I'_{SC}$ may be further corrected to acquire a more uniform image, such as a second uniformity enhancement image, with details as follows.

In Step S13, the above-mentioned first uniformity enhancement image $I'_{SC}$ is divided by the receiving sensitivity distribution value $S_{body}$ of the body coil to acquire a second uniformity enhancement image. For example, the second uniformity enhancement image $I_{new}$ may be acquired by the following equation (4):

$$I_{new} = I'_{SC}/S_{body} \quad (4)$$

In one embodiment, the receiving sensitivity distribution value $S_{body}$ of the body coil may be acquired by performing simulation on the body coil in the magnetic resonance imaging scanning system. It should be understood by those skilled in the art that the simulation may be performed off-line. In another embodiment, the receiving sensitivity distribution value of the body coil may be retrieved directly from a system file of the magnetic resonance imaging scanning system.

Therefore, before Step S13, the method may further include: utilizing prior knowledge to acquire a receiving sensitivity distribution value of the body coil. The prior knowledge may comprise, for example, a receiving sensitivity distribution value of the body coil acquired by performing simulation on the body coil.

The receiving sensitivity distribution value $S_{body}$ of the body coil acquired by utilizing the prior knowledge is real, instead of the assumed "1".

In practice, there may also be cases where the spatial signal distribution value is not uniform, resulting from the distribution of the transmitting RF field (e.g., the flip angle has different values at the points in space) for some reasons of hardware. Therefore, in the embodiments of the present invention, Step S15 may further be included, such that the second uniformity enhancement image $I_{new}$ may be further corrected to acquire a more uniform image, such as a third uniformity enhancement image.

In step S15, the above-mentioned second uniformity enhancement image $I_{new}$ is divided by the spatial signal distribution value resulting from the field strength distribution of the transmitting RF field to acquire a third uniformity enhancement image $I'_{new}$. For example, the third uniformity enhancement image $I'_{new}$ may be acquired by means of the following equation (5):

$$I'_{new} = \frac{I_{new}}{f'_{PSD}(I', FA)} = \frac{I'_{SC}}{S_{body} * f'_{PSD}(I', FA)} \quad (5)$$

In the above equation (5), $f'_{PSD}(I',FA)$ is a function using the patient I' and the flip angle FA as variables at a preset pulse sequence (which may be different from the pulse sequence during the pre-scan) during the imaging scan for the patient. The patient I' may include a vertical relaxation time T1 and a horizontal relaxation time T2 of the tissue to be scanned of the patient. When the tissue structure is constant, the vertical relaxation time T1 and the horizontal relaxation time T2 are fixed values. When the distribution of flip angles at the points in the space is not uniform when the RF pulses are emitted, the distribution of values of $f'_{PSD}(I', FA)$ is not uniform, either. The $f'_{PSD}(I',FA)$ is just the spatial signal distribution value resulting from the RF field distribution.

Optionally, before Step S15, the following step may also be included: acquiring a spatial signal distribution value resulting from the field strength distribution of the transmitting RF field according to a Bloch equation. In one embodiment, the Bloch equation may be described as equation (6) as follows:

$$\frac{d\vec{M}}{dt} = \gamma \vec{M} \times \vec{B}_{ext} + \frac{1}{T_1}(M_0 - M_z)\hat{z} - \frac{1}{T_2}\vec{M}_\perp \quad (6)$$

In the above equation (6), $\vec{B}_{ext}$ is the field strength distribution of the transmitting RF field; if the distribution values of the points thereof in the space are not uniform, the flip angles FA corresponding to the points in the space will not be exactly the same, thus causing the magnetic resonance signal distribution to be not uniform. M is the magnetization vector of a proton in a specific sample (e.g., a sample of muscle tissue or bone tissue), $M_0$ is the magnetization vector when the proton spins to a balanced state, $M_z$ is a vertical magnetization vector (a component of $\vec{M}$ in the direction of an external magnetic field ($B_0$), i.e., a Z-axis), $\vec{M}_\perp$ is a horizontal magnetization vector (a component of $\vec{M}$ in the direction perpendicular to the external magnetic field, i.e., in the plane X, Y), and $\hat{z}$ denotes the above-mentioned Z-axis (i.e., the above-mentioned "vertical" direction). Therefore, $(M_0-M_z)\hat{z}$ may denote a vertical component of $(M_0-M_z)$; $\gamma$ is the gyromagnetic ratio, which is a constant; and T1 is the vertical relaxation time of the specific sample, and T2 is the horizontal relaxation time of the specific sample. Note that $M_0$, $\vec{B}_{ext}$, T1 and T2 are predicted values, $\vec{M}$ (including $M_z$ and $\vec{M}_\perp$) is a measured value. In the embodiments of the present invention, the above-mentioned Bloch equation is solved, and a steady-state solution of the magnetization vector $\vec{M}$ in the rotating coordinate system may be obtained to acquire the spatial signal distribution value resulting from the field strength distribution of the transmitting RF field, i.e., $f'_{PSD}(I',FA)$. The process of solving the Bloch equation is well known in the art and will not be repeated here in details.

In the embodiments of the present invention, the tissue structure of the above-mentioned specific sample is determined according to the tissue structure of the part-to-be-detected of the patient. For example, when the part-to-be-detected of the patient is a bone tissue, a bone tissue may be selected as the specific sample; and when the part-to-be-detected of the patient is a muscle tissue, a muscle sample may be selected as the specific sample.

Optionally, the above tissue structure of the specific sample may give a statistical or empirical vertical relaxation time T1 and horizontal relaxation time T2 according to the tissue structure of the part-to-be-detected of the patient.

Optionally, before Step S15, a step of acquiring the field strength distribution of the transmitting RF field of the body coil may be included: using the prior knowledge to acquire the field strength distribution of the transmitting RF field of the body coil. The prior knowledge may comprise, for example, a field strength distribution of the transmitting RF field acquired by performing simulation on the body coil.

The above-mentioned simulation on the body coil may be done by a dedicated simulation software for magnetic resonance coil, or may also be done by an actual measurement method.

FIG. 2 is a block diagram of an apparatus for correcting a uniformity of a magnetic resonance image provided by one embodiment of the present invention. As shown in FIG. 2, the apparatus for correcting a uniformity of a magnetic resonance image may comprise a first uniformity enhancement module 21 and a second uniformity enhancement module 23. In one embodiment, the apparatus for correcting a uniformity of a magnetic resonance image may further comprise a third uniformity enhancement module 25.

The first uniformity enhancement module 21 is used to acquire a first enhancement image $I'_{SC}$ by a phased-array uniformity enhancement method. The first uniformity enhancement module 21 may correct the original scanned image of the patient according to the body coil image and the surface coil image acquired during the pre-scan, for example, to acquire the receiving sensitivity $S_{sc}$ of the surface coil according to the above equation (3), and utilize the receiving sensitivity $S_{sc}$ to correct the original image to acquire the first uniformity enhancement image $I'_{SC}$, for example, $I'_{SC} = f_{PSD}(I,FA)*S_{sc}$.

The second uniformity enhancement module 23 may further correct the first uniformity enhancement image by acquiring the actual receiving sensitivity of the body coil. The second uniformity enhancement module 23 may be used to divide the above-mentioned first uniformity enhancement image $I'_{SC}$ by the receiving sensitivity distribution value $S_{body}$ of the body coil to acquire a second uniformity enhancement image. For example, the second uniformity enhancement image $I_{new}$ may be acquired by the above-mentioned equation (4).

In one embodiment of the present invention, the apparatus for correcting a uniformity of a magnetic resonance image may further comprise a first simulation module for performing simulation on a body coil in a magnetic resonance imaging scanning system to acquire a receiving sensitivity distribution value $S_{body}$ of the body coil. In another embodiment of the present invention, the second uniformity enhancement module 23 may retrieve the receiving sensitivity distribution value $S_{body}$ of the body coil from the system file.

The third uniformity enhancement module 25 may further correct the second uniformity enhancement image by acquiring the spatial signal distribution value resulting from the field strength distribution of the transmitting RF field. The third uniformity enhancement module 25 may be used to divide the above-mentioned second uniformity enhancement image $I_{new}$ by the spatial signal distribution value resulting from the field strength distribution of the transmitting RF field so as to acquire a second uniform image I'$_{new}$. For example, the second uniform image I'$_{new}$ may be acquired by the above equation (5).

Optionally, the apparatus for correcting a uniformity of a magnetic resonance image of the embodiments of the present invention may further comprise a spatial signal distribution value acquisition module for acquiring the spatial signal distribution value resulting from the field strength distribution of the transmitting RF field according to the Bloch equation. The spatial signal distribution value resulting from the field strength distribution of the transmitting RF field acquired by the spatial signal distribution value acquisition module may be used by the third uniformity enhancement module 25 to perform image correction.

In the embodiments of the present invention, a second simulation module may further be included, which may be used for performing simulation on the body coil to acquire the field strength distribution of the transmitting RF field of the body coil. The field strength distribution of the transmitting RF field of the body coil acquired by the second simulation module may be used by the spatial signal distribution value acquisition module to solve the Bloch equation.

The above-mentioned first simulation module and second simulation module may acquire the receiving sensitivity of the body coil and the field strength distribution of the transmitting RF field respectively according to the design parameters of the magnetic resonance coil.

As an exemplary embodiment of the present invention, the first uniformity enhancement image may be acquired by only correcting the receiving sensitivity. When the uniformity needs to be further improved, the second uniformity enhancement image is acquired by further correcting the field strength distribution of the transmitting RF field.

The magnetic resonance image uniformity enhancement method and apparatus of the embodiments of the present invention correct the non-uniformity of the image due to the non-uniformity of the receiving sensitivity of the body coil by dividing the PURE image by the receiving sensitivity distribution value of the body coil, and may further correct the non-uniformity of the image resulting from the field strength distribution of the transmitting RF field. Therefore, by the technical solution of the present invention, a magnetic resonance image more uniform than the PURE image can be acquired, and the image quality can be improved to meet the needs of users.

FIG. 3 is a uniformity enhancement image acquired by the existing image uniformity enhancement technique, FIG. 4 is a uniformity enhancement image acquired by correcting the receiving sensitivity of the image in FIG. 3 by the embodiment of the present invention, and FIG. 5 is a uniformity enhancement image acquired by correcting the transmitting RF field of the image in FIG. 4 by the embodiment of the present invention. FIGS. 3, 4 and 5 each include two images. By comparing FIGS. 3, 4 and 5, it can be seen that the images in FIGS. 4 and 5 are more uniform than those in FIG. 3.

Some exemplary embodiments have been described in the above. However, it should be understood that various modifications may be made thereto. For example, if the described techniques are carried out in different orders, and/or if the components in the described system, architecture, apparatus or circuit are combined in different ways and/or replaced or supplemented by additional components or equivalents thereof, proper results may still be achieved. Accordingly, other implementation also falls within a protection range of the claims.

What is claimed is:

1. A method for correcting a uniformity of a magnetic resonance image, comprising:
    acquiring a first uniformity enhancement image by a phased-array uniformity enhancement method comprising:
        receiving a body coil image and a surface coil image;
        receiving an original image; and
        performing correction of the original image according to the body coil image and the surface coil image to derive the first uniformity enhancement image; and
    dividing the first uniformity enhancement image by a receiving sensitivity distribution value of a body coil in a magnetic resonance imaging device, so as to acquire a second uniformity enhancement image.

2. The method for correcting a uniformity of a magnetic resonance image according to claim 1, further comprising:
    dividing the second uniformity enhancement image by a spatial signal distribution value resulting from a field strength distribution of a transmitting radio frequency (RF) field, so as to acquire a third uniformity enhancement image.

3. The method for correcting a uniformity of a magnetic resonance image according to claim 1, before the step of acquiring the first uniformity enhancement image, further comprising:
    utilizing prior knowledge to acquire the receiving sensitivity distribution value of the body coil.

4. The method for correcting a uniformity of a magnetic resonance image according to claim 3, wherein the prior knowledge comprises a receiving sensitivity distribution value of the body coil acquired by performing simulation on the body coil.

5. The method for correcting a uniformity of a magnetic resonance image according to claim 2, before the step of acquiring the third uniformity enhancement image, further comprising:
    acquiring the spatial signal distribution value resulting from the field strength distribution of the transmitting RF field according to a Bloch equation.

6. The method for correcting a uniformity of a magnetic resonance image according to claim 5, wherein the Bloch equation is described as:

$$\frac{d\vec{M}}{dt} = \gamma \vec{M} \times \vec{B}_{ext} + \frac{1}{T_1}(M_0 - M_z)\hat{z} - \frac{1}{T_2}\vec{M}_\perp,$$

wherein $\vec{B}_{ext}$ represents the field strength distribution of the transmitting RF field;

$\vec{M}$ represents a magnetization vector of a proton in a specific sample, which comprises $M_z$ and $\vec{M}_\perp$, $M_0$ represents a magnetization vector when proton spins to a balanced state;

$M_z$ represents a vertical magnetization vector;

$\vec{M}_\perp$ is a horizontal magnetization vector;

$\hat{z}$ denotes a vertical direction;

$\gamma$ denotes a gyromagnetic ratio, which is a constant;

T1 is a vertical relaxation time of the specific sample, and T2 is a horizontal relaxation time of the specific sample, wherein $M_0$, $\vec{B}_{ext}$, T1 and T2 are predicted values, and $\vec{M}$ is a measured value; and a steady-state solution of the magnetization vector $\vec{M}$ in a rotating coordinate system is obtained by solving the Bloch equation, so as to obtain the spatial signal distribution value resulting from the transmitting RF field.

7. The method for correcting a uniformity of a magnetic resonance image according to claim 6, before the step of acquiring the spatial signal distribution value resulting from the field strength distribution of the transmitting RF field, further comprising:
utilizing prior knowledge to acquire the field strength distribution of the transmitting RF field of the body coil.

8. The method for correcting a uniformity of a magnetic resonance image according to claim 7, wherein the prior knowledge comprises: a field strength distribution of the transmitting RF field acquired by performing simulation on the body coil.

9. An apparatus for correcting a uniformity of a magnetic resonance image, comprising:
a first uniformity enhancement module for acquiring a first uniformity enhancement image, wherein to acquire the first uniformity enhancement image, the first uniformity enhancement module is configured to:
receiving a body coil image and a surface coil image;
receiving an original image; and
perform correction of the original image according to the body coil image and the surface coil image to derive the first uniformity enhancement image; and
a second uniformity enhancement module for dividing the first uniformity enhancement image by a receiving sensitivity distribution value of a body coil in a magnetic resonance imaging device, so as to acquire a second uniformity enhancement image.

10. The apparatus for correcting a uniformity of a magnetic resonance image according to claim 9, further comprising a third uniformity enhancement module for dividing the second uniformity enhancement image by a spatial signal distribution value resulting from a field strength distribution of a transmitting radio-frequency (RF) field, so as to acquire a third uniformity enhancement image.

11. The apparatus for correcting a uniformity of a magnetic resonance image according to claim 9, further comprising a first simulation module for performing simulation on the body coil to acquire a receiving sensitivity distribution value of the body coil.

12. The apparatus for correcting a uniformity of a magnetic resonance image according to claim 9, further comprising a spatial signal distribution value acquisition module for acquiring the spatial signal distribution value resulting from the field strength distribution of the transmitting RF field according to a Bloch equation.

13. The apparatus for correcting a uniformity of a magnetic resonance image according to claim 12, wherein the Bloch equation is described as:

$$\frac{d\vec{M}}{dt} = \gamma \vec{M} \times \vec{B}_{ext} + \frac{1}{T_1}(M_0 - M_z)\hat{z} - \frac{1}{T_2}\vec{M}_\perp,$$

wherein $\vec{B}_{ext}$ represents the field strength distribution of the transmitting RF field; $\vec{M}$ represents a magnetization vector of a proton in a specific sample, which comprises $M_z$ and $\vec{M}_\perp$, $M_0$ represents a magnetization vector when proton spins to a balanced state;

$M_z$ represents a vertical magnetization vector;

$\vec{M}_\perp$ is a horizontal magnetization vector; $\hat{z}$ denotes a vertical direction;

$\gamma$ denotes a gyromagnetic ratio, which is a constant;

T1 is a vertical relaxation time of the specific sample, and T2 is a horizontal relaxation time of the specific sample, wherein $M_0$, $\vec{B}_{ext}$, T1 and T2 are predicted values, and $\vec{M}$ is a measured value; and a steady-state solution of the magnetization vector $\vec{M}$ in a rotating coordinate system is obtained by solving the Bloch equation, so as to obtain the spatial signal distribution value resulting from the transmitting RF field.

14. The apparatus for correcting a uniformity of a magnetic resonance image according to claim 13, further comprising a second simulation module for performing simulation on the body coil to acquire the field strength distribution of the transmitting RF field of the body coil.

* * * * *